(12) United States Patent
Adams et al.

(10) Patent No.: US 6,252,417 B1
(45) Date of Patent: *Jun. 26, 2001

(54) FAULT IDENTIFICATION BY VOLTAGE POTENTIAL SIGNATURE

(75) Inventors: Frederick G. Adams, Spring Lake Heights, NJ (US); Robert D. Adams, Vestal, NY (US); Edmond S. Cooley, Orford, NH (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/296,336

(22) Filed: Apr. 22, 1999

(51) Int. Cl.[7] .............................. H03K 19/00; G01R 31/28
(52) U.S. Cl. ............................... 326/16; 326/95; 714/724; 714/734
(58) Field of Search .................................. 326/16, 93, 95, 326/104, 112; 714/799, 734, 736, 724

(56) References Cited

U.S. PATENT DOCUMENTS

| | | | |
|---|---|---|---|
| 4,899,066 | * 2/1990 | Aikawa et al. | 307/45.2 |
| 5,285,119 | * 2/1994 | Takahashi | 326/57 |
| 5,345,423 | 9/1994 | Koh et al. . | |
| 5,467,026 | 11/1995 | Arnold . | |
| 5,550,490 | * 8/1996 | Durham et al. | 326/98 |
| 5,581,563 | 12/1996 | Penza et al. . | |
| 5,592,494 | 1/1997 | Nozuyama . | |
| 5,629,947 | 5/1997 | Kellum et al. . | |
| 5,633,599 | 5/1997 | Kubota . | |
| 5,638,009 | * 6/1997 | Sutherland et al. | 326/83 |
| 5,740,180 | 4/1998 | Barel et al. . | |
| 5,896,046 | * 4/1999 | Bjorksten et al. | 326/98 |
| 5,986,475 | * 11/1999 | Kim et al. | 326/95 |
| 5,999,019 | * 12/1999 | Zheng et al. | 326/98 |

FOREIGN PATENT DOCUMENTS 58-213531 * 12/1983 (JP) .

OTHER PUBLICATIONS

Rhyne, "Fundamentals of Digital Systems Design", N.J., pp. 70–71, 1973.*

* cited by examiner

Primary Examiner—Patrick Wamsley
Assistant Examiner—Daniel D. Chang
(74) Attorney, Agent, or Firm—Schmeiser, Olsen & Watts; Eugene I. Shkurko

(57) ABSTRACT

A logic gate is provided that comprises a sensing circuit coupled to a test output and to an internal node of the logic gate. The sensing circuit is adapted to sense a voltage on the internal node and to output a signal indicating a level of the voltage. The sensing circuit is not used during normal operation of the logic gate and preferably comprises only a single FET that is directly coupled to both the internal node and to the test output. The logic gate also preferably comprises a pre-charge circuit for pre-charging the test output to a predetermined voltage level prior to testing. An IC chip may be formed from a plurality of the logic gates wherein each logic gate comprises a sensing circuit coupled to a test output and to an internal node of the logic gate. Each sensing circuit may be coupled to the same test output or to a unique test output for the sensing circuit's logic gate. The sensing circuits are not used during normal operation of the IC chip.

30 Claims, 2 Drawing Sheets

FAULT IDENTIFICATION BY VOLTAGE POTENTIAL SIGNATURE

FIELD OF THE INVENTION

The present invention relates to the identification of faults within electronic circuitry and more particularly to fault identification by voltage potential signature.

BACKGROUND OF THE INVENTION

To operate properly, electronic circuitry (e.g., digital logic) must be fault free. Accordingly, numerous techniques have been developed to identify circuit faults such as level sensitive scan design (LSSD) testing, quiescent current (Iddq) measurements and delay fault measurements.

During LSSD testing of a circuit, a logical voltage pattern is applied to the circuit and the resulting logical circuit outputs are observed. The resulting logical circuit outputs then are compared to the logical expected values for the circuit, and a fault is identified by a discrepancy therebetween. LSSD testing thus employs a simple binary comparison that provides no information about the internal voltage potentials of a circuit. Faults which degrade a circuit's internal voltage potentials without affecting the circuit's logical outputs (i.e., potential faults), therefore, are unidentifiable by binary testing schemes such as LSSD testing.

During an Iddq measurement, a DC voltage pattern is applied to a circuit, the power supply current supplied to the circuit is measured and the resulting power supply current is compared to an expected power supply current in order to identify faults. Similarly, during a delay fault measurement, the voltage pattern applied to a circuit's inputs is changed from one voltage pattern to another, the time required for the circuit's outputs to change states in response thereto (i.e., the circuit delay) is measured and the resulting circuit delay is compared to an expected circuit delay in order to identify faults. While both Iddq and delay fault measurements are analog in nature (e.g., measuring an analog power supply current and an analog circuit delay), neither measurement provides information about a circuit's internal voltage potentials. Additionally, as electronic circuits progress into the deep sub-micron regime, larger sub-threshold leakage currents result diminishing the usefulness of Iddq measurements. Accordingly, a need exists for an improved method and apparatus for identifying circuit faults.

SUMMARY OF THE INVENTION

To address the needs of the prior art, an inventive logic gate is provided that comprises a sensing circuit coupled to a test output (e.g., a test output of the logic gate or a test output of an integrated circuit (IC) chip employing the logic gate). As used herein, "coupled" means coupled directly or indirectly so as to operate. The sensing circuit also is coupled to an internal node of the logic gate (i.e., a node other than an output of the logic gate) and is adapted to sense a voltage on the internal node and to output a signal indicating a level of the voltage (i.e., a voltage potential signature). The sensing circuit is not used during normal operation of the logic gate and preferably comprises only a single field-effect-transistor (FET) (e.g., a p-channel metal-oxide-semiconductor FET or "PFET") that is directly coupled to both the internal node and to the test output.

The inventive logic gate preferably comprises a pre-charge circuit for pre-charging the test output to a predetermined voltage level prior to testing (i.e., a pre-test voltage level). The pre-charge circuit may, for example, comprise an FET such as an n-channel metal-oxide-semiconductor FET or "NFET".

An IC chip may be formed from a plurality of the inventive logic gates wherein each logic gate comprises a sensing circuit coupled to a test output and to an internal node of the logic gate. Each sensing circuit may be coupled to the same test output (e.g., a "common" test output for the IC chip) or to a unique test output for the sensing circuit's logic gate. Each logic gate's sensing circuit thus senses a voltage present on an internal node of the logic gate and outputs a signal indicating a level of the voltage. The sensing circuits are not used during normal operation of the IC chip. The IC chip preferably comprises one or more pre-charge circuits for pre-charging the common test output or each logic gate's test output to a pre-test voltage level.

By thus providing logic gates and integrated circuits that are testable for both the presence of and the location of potential faults IC quality assurance and IC testing/troubleshooting are greatly enhanced.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
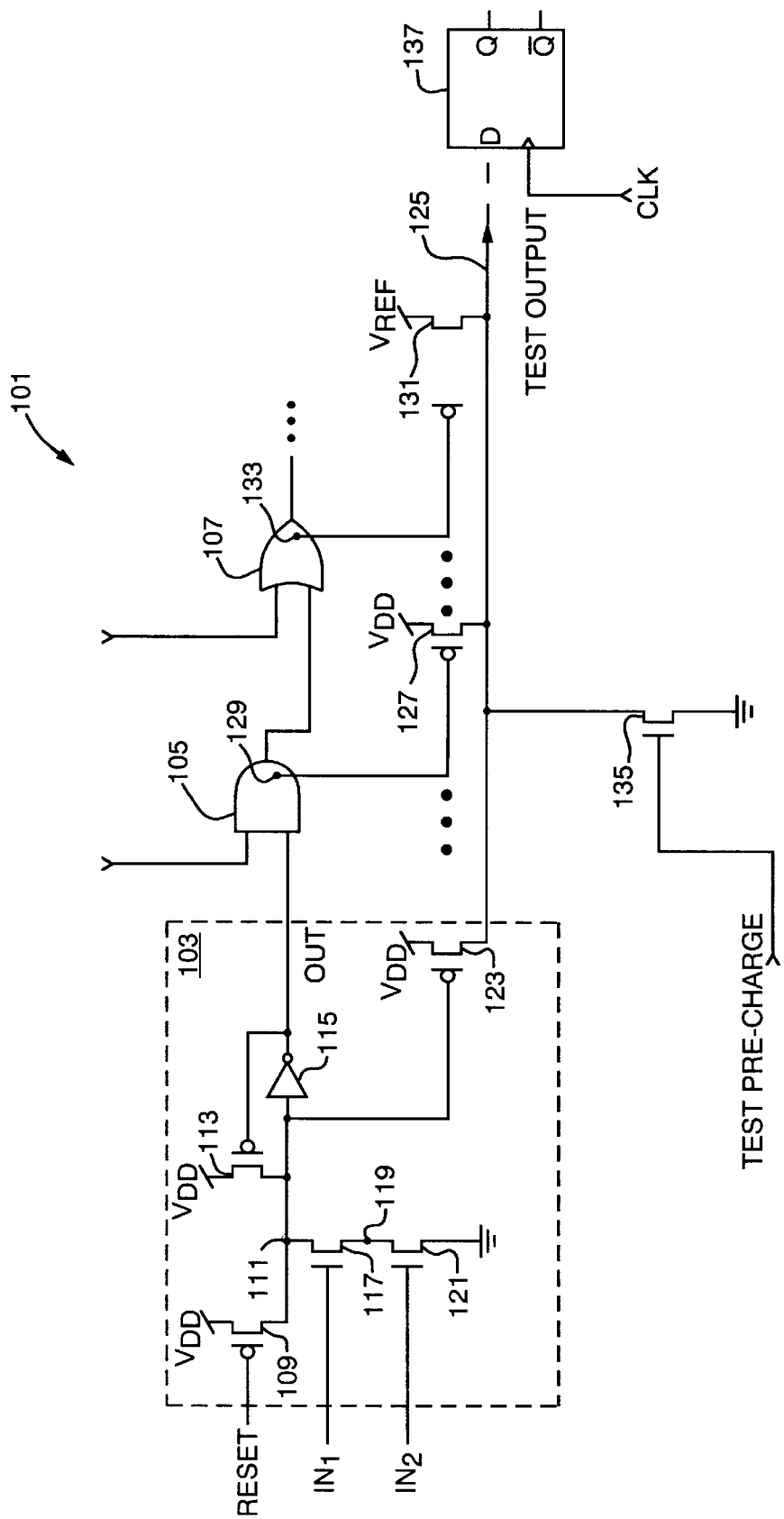
FIG. 1 is a schematic diagram of an integrated circuit configured in accordance with a first aspect of the present invention.

FIG. 1 is a schematic diagram of an integrated circuit (IC) 101 configured in accordance with a first aspect of the present invention. The inventive IC 101 comprises a plurality of dynamic logic circuits including a first AND gate 103, a second AND gate 105, and a first OR gate 107 as shown. The first AND gate 103 has a first input ($IN_1$), a second input ($IN_2$), and a reset input (RESET), and an output coupled to a first input of the second AND gate 105. The second AND gate 105 has a second input coupled to another portion of the inventive IC 101 (not shown) and an output coupled to a first input of the first OR gate 107. The first OR gate 107 has both a second input and an output coupled to another portion of the inventive IC 101 (not shown).

Each dynamic logic gate 103–107 comprises a plurality of interconnected transistor elements as is known in the art. For example, the first AND gate 103 comprises a first p-channel metal-oxide-semiconductor field-effect-transistor (PFET) 109 having a source coupled to a positive voltage rail ($V_{DD}$), a gate which serves as the RESET input and a drain coupled to an internal node (e.g., dynamic node 111), and a second PFET 113 having a source coupled to $V_{DD}$, a gate coupled to the dynamic node 111 via an inverter 115 and a drain coupled to the dynamic node 111. The first AND gate 103 further comprises a first n-channel metal-oxide-semiconductor field-effect-transistor (NFET) 117 having a drain coupled to the dynamic node 111, a gate which serves as the first input ($IN_1$) of the first AND gate 103 and a source coupled to a secondary node 119, and a second NFET 121 having a drain coupled to the secondary node 119, a gate which serves as the second input ($IN_2$) of the first AND gate 103 and a source coupled to ground. The second AND gate 105 is identically configured, while the first OR gate 107 is configured to perform an OR function as is known in the art.

In addition to the logic gates 103–107, the inventive IC 101 comprises a plurality of sensing circuits that allow testing of the inventive IC 101 for potential faults. Specifically, the inventive IC 101 comprises a first sensing circuit formed from a third PFET 123 having a source coupled to $V_{DD}$, a gate coupled to the dynamic node 111 and a drain coupled to a test output 125 of the inventive IC 101, a second sensing circuit formed from a fourth PFET 127 having a source coupled to $V_{DD}$, a gate coupled to an internal node 129 (e.g., a dynamic node) of the second AND gate 105 and a drain coupled to the test output 125, and a third sensing circuit formed from a fifth PFET 131 having a source coupled to a reference potential ($V_{REF}$), a gate coupled to an internal node 133 (e.g., a dynamic node) of the first OR gate 107 and a drain coupled to the test output 125. Each PFET 123, 127 and 131 has a threshold voltage ($V_{TH}$). If desired, additional sensing circuits may be provided within the inventive IC 101 for testing for potential faults at other locations.

The inventive IC 101 further comprises a test pre-charge circuit formed from a third NFET 135 having a drain coupled to the test output 125, a gate which serves as a test pre-charge input, and a source coupled to ground. A latch 137 preferably is provided for latching the voltage level present on the test output 125 as described below.

During normal operation of the inventive IC 101, the dynamic node 111 of the first AND gate 103 is pre-charged to $V_{DD}$ by applying a low voltage ("low") RESET signal to the gate of the first PFET 109. With the gate of the first PFET 109 low, the first PFET 109 turns ON, and the dynamic node 111 charges toward $V_{DD}$. As the dynamic node 111 charges toward $V_{DD}$, the switching threshold of the inverter 115 is passed, the gate of the second PFET 113 is driven low and the second PFET 113 is turned ON to assist in the charging of the dynamic node 111. The internal node 129 and the internal node 133 similarly are pre-charged.

With the dynamic node 111 properly pre-charged to $V_{DD}$, the output of the first AND gate 103 is driven to a low logic state via the inverter 115, and the third PFET 123 is OFF. Similarly, with the internal node 129 and the internal node 133 properly pre-charged to $V_{DD}$, the fourth PFET 127 and the fifth PFET 131 are OFF.

Thereafter, the RESET signal is switched to a high voltage ("high"), the first PFET 109 is turned OFF, and the first AND gate 103's output logic state is dictated by the voltage states present on the first and the second inputs ($IN_1$), ($IN_2$) of the first NFET 117 and the second NFET 121, respectively. For instance, if the second input ($IN_2$) is held low, the second NFET 121 is OFF and no path can be created between the dynamic node 111 and ground whether the first NFET 117 is ON or OFF (e.g., whether the first input ($IN_1$) is held high or low). Therefore, the dynamic node 111 remains charged at $V_{DD}$, and the output of the first AND gate 103 remains low. Similarly, if the first input ($IN_1$) is held low, the first NFET 117 is OFF and no path can be created between the dynamic node 111 and ground whether the second NFET 121 is ON or OFF (e.g., whether the second input ($IN_2$) is held high or low). The dynamic node 111, therefore, remains charged at $V_{DD}$, and the output of the first AND gate 103 remains low.

Only when both the first input ($IN_1$) and the second input ($IN_2$) are driven high are both the first NFET 117 and the second NFET 121 turned ON, is a path created between the dynamic node 111 and ground, is the dynamic node 111 pulled low, and is the output of the first AND gate 103 switched from a low to a high logic state as summarized in TABLE 1.

TABLE 1

| $IN_1$ | $IN_2$ | DYNAMIC NODE 111 | OUT |
|---|---|---|---|
| 0 | 0 | 1 | 0 |
| 0 | 1 | 1 | 0 |
| 1 | 0 | 1 | 0 |
| 1 | 1 | 0 | 1 |

The output of the first AND gate 103 propagates to the first input of the second AND gate 105, and affects the internal node 129 and the output of the second AND gate 105 accordingly. Thereafter, the output of the second AND gate 105 propagates to the first input of the first OR gate 107, and affects the internal node 133 and the output of the first OR gate 107 accordingly. The output of the first OR gate 107 then propagates to another location within the inventive IC 101 (not shown).

The above described operation of the inventive IC 101 represents the "ideal" operation of the inventive IC 101 wherein the dynamic node 111, the internal node 129 and the internal node 133 are properly pre-charged. As previously described, potential faults (e.g., short circuits, open circuits and resistive defects) may exist within the inventive IC 101 that do not affect the logical outputs of the first AND gate 103, the second AND gate 105, the first OR gate 107 or other components within the inventive IC 101 and are thus difficult to detect by conventional testing techniques. For example, one or more faults may exist that prevent the dynamic node 111, the internal node 129 or the internal node 133 from properly pre-charging to $V_{DD}$. The inventive IC 101 can identify such potential faults.

To detect potential faults within the inventive IC 101, a test pattern (e.g., a DC speed test pattern) is applied to the inventive IC 101 via the first and the second inputs ($IN_1$), ($IN_2$) and a high voltage pulse, test pre-charge signal is applied to the gate of the third NFET 135. In response to the test pre-charge pulse, the third NFET 135 turns ON and the test output 125 is pulled to ground so as to "pre-discharge" the test output 125. After a delay sufficient to allow the various potentials within the inventive IC 101 to settle, the voltage present on the test output 125 is evaluated (e.g., preferably by capturing the voltage present on the test output 125 via the latch 137 following the delay). This procedure preferably is repeated at least twice for the inventive IC 101 to facilitate the exercise of all circuit groups within the inventive IC 101 in both a pre-charge and evaluate condition (e.g., when the logic is in both a high and a low state).

As an example, assuming the test output 125 has been pre-discharged, if during testing of the inventive IC 101 the dynamic node 111 fails to pre-charge to a voltage greater than $V_{DD}-V_{TH}$, the third PFET 123 turns ON, pulling the test output 125 to $V_{DD}$ so as to identify the presence of a potential fault within the inventive IC 101. Similarly, if the internal node 129 fails to pre-charge to a voltage greater than $V_{DD}-V_{TH}$, the fourth PFET 127 turns ON, pulling the test output 125 to $V_{DD}$ so as to identify the presence of a potential fault within the inventive IC 101. If the internal node 133 fails to pre-charge to a voltage greater than $V_{REF}-V_{TH}$, the fifth PFET 131 turns ON, pulling the test output 125 to $V_{REF}$ so as to identify the presence of a potential fault within the inventive IC 101. By employing a reference potential ($V_{REF}$) with the inventive sensing circuits 123, 127 or 131, any potential fault value $V_{REF}-V_{TH}$ may be identified.

Figure 2:
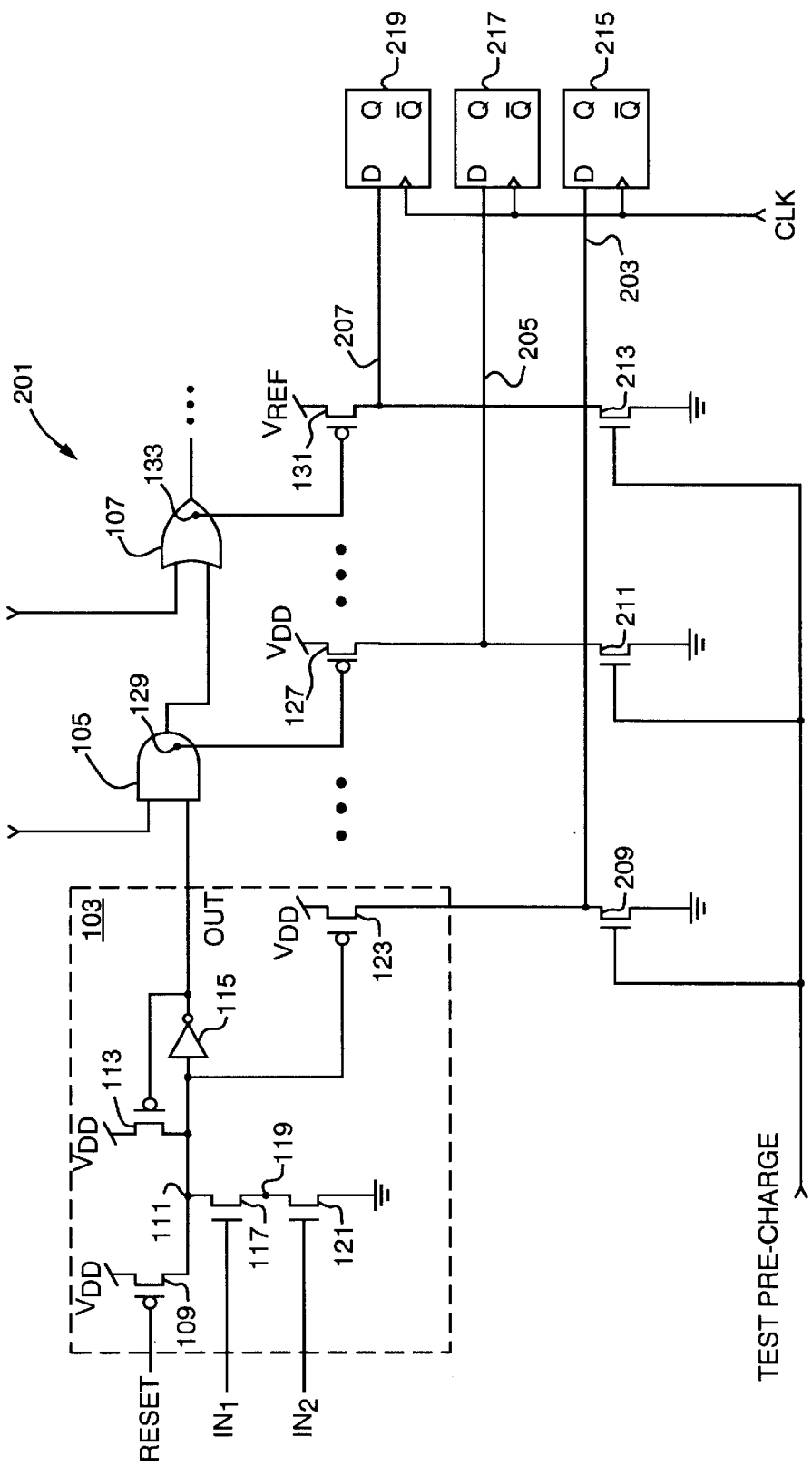
FIG. 2 is a schematic diagram of an integrated circuit configured in accordance with a second aspect of the present invention.

FIG. 2 is a schematic diagram of an integrated circuit 201 configured in accordance with a second aspect of the present invention. The inventive integrated circuit 201 is identical to the inventive IC 101 with the exception that the third PFET 123, the fourth PFET 127 and the fifth PFET 131 are each provided within a unique test output 203–207, a unique pre-charge NFET 209–213 and a unique latch 215–219 as shown. In this manner, by supplying unique test outputs 203–207 rather than a common test output as in the inventive IC 101 of FIG. 1, the location of any potential fault can be isolated to a particular faulted circuit (e.g., the first AND gate 103, the second AND gate 105 and/or the first OR gate 107).

By thus providing logic gates and integrated circuits that are testable for both the presence of and the location of potential faults, both IC quality assurance and IC testing/ troubleshooting are greatly enhanced.

The foregoing description discloses only the preferred embodiments of the invention, modifications of the above disclosed apparatus and method which fall within the scope of the invention will be readily apparent to those of ordinary skill in the art. For instance, while the present invention has been described with reference to pre-charge high dynamic logic circuitry, it will be understood that potential faults within other circuitry types including pre-charge low dynamic logic (e.g., by employing an NFET sensing circuit and a PFET pre-charge circuit) and static logic circuitry may be similarly identified. A similar structure (e.g., NFET sensing circuits) may be employed to identify low voltage or "low potential" faults, although dynamic logic circuits will detect erroneous low potential faults. Other circuits may be employed as sensing circuits and as test pre-charge circuits such as an operational amplifier or other analog circuit.

Accordingly, while the present invention has been disclosed in connection with the preferred embodiments thereof, it should be understood that other embodiments may fall within the spirit and scope of the invention, as defined by the following claims.

The invention claimed is:

1. A logic gate comprising:
a sensing circuit coupled to a test output and to an internal node of the logic gate for sensing a voltage on the internal node and for outputting a signal indicating a level of said voltage, wherein the sensing circuit is not used during normal operation of the logic gate; and
a pre-charge circuit coupled to the test output for pre-charging the test output to a pre-test voltage level.

2. The logic gate of claim 1 wherein the sensing circuit includes only a single FET.

3. The logic gate of claim 2 wherein the single FET is directly coupled to both the internal node and to the test output.

4. The logic gate of claim 3 wherein the single FET is selected from the group consisting of a PFET and an NFET.

5. The logic gate of claim 1 wherein the pre-charge circuit comprises a pre-charge FET.

6. The logic gate of claim 5 wherein the pre-charge FET is selected from the group consisting of an NFET and a PFET.

7. An IC chip comprising:
a plurality of logic gates; and
each of the logic gates comprising:
a sensing circuit coupled to a test output and to an internal node of the logic gate for sensing a voltage on the internal node and for outputting a signal indicating a level of said voltage, wherein the sensing circuit is not used during normal operation of the logic gate;
wherein the test output comprises a common test output for the IC chip; and
a pre-charge circuit coupled to the common test output for pre-charging the common test output to a pre-test voltage level.

8. The IC chip of claim 7 wherein at least one of the logic gates comprises a dynamic-logic circuit.

9. The IC chip of claim 7 wherein each sensing circuit includes only a single FET.

10. The IC chip of claim 7 wherein the test output comprises a unique test output for each logic gate.

11. The IC chip of claim 10 wherein each logic gate further comprises a pre-charge circuit coupled to the logic gate's unique test output for pre-charging the unique test output to a pre-test voltage level.

12. A logic gate comprising:
sensing means coupled to a test output and to an internal node of the logic gate for sensing a voltage on the internal node and for outputting a signal indicating a level of said voltage, wherein the sensing means is not used during normal operation of the logic gate; and
pre-charge means coupled to the test output for pre-charging the test output to a pre-test voltage level.

13. A method of testing a logic gate having an internal node comprising:
applying a test pattern to the logic gate;
sensing a voltage on the internal node of the logic gate;
outputting a signal to the test output indicating a level of the voltage on the internal node;
capturing the signal output to the test output; and
pre-charging the test output to a pre-test voltage level prior to capturing the signal output to the test output.

14. The method of claim 13 further comprising waiting a predetermined time period after pre-charging the test-output before capturing the signal output to the test output.

15. A logic gate comprising:
an internal node, wherein the internal node is a node of the logic gate other than an output of the logic gate;
a sensing circuit coupled to the internal node and to a test output for sensing a voltage on the internal node and for outputting a signal indicating a level of said voltage, wherein the sensing circuit is not used during normal operation of the logic gate.

16. The logic gate of claim 15 wherein said level of said voltage indicates the presence of a potential fault within the logic gate.

17. The logic gate of claim 15 wherein the logic gate is a logical AND gate.

18. The logic gate of claim 15 wherein said test output indicates the location of a potential fault within an integrated circuit.

19. The logic gate of claim 15 wherein the logic gate is a logical OR gate.

20. The logic gate of claim 15 further comprising a pre-charge circuit coupled to the test output for pre-charging the test output to a pre-test voltage level.

21. The logic gate of claim 20 wherein the pre-charge circuit is coupled to a test output of a second logic gate.

22. The logic gate of claim 20 wherein the pre-charge circuit comprises a pre-charge FET.

23. An integrated circuit comprising:
- a plurality of logic gates, wherein each of the logic gates includes:
- an internal node, wherein the internal node is a node of the logic gate other than an output of the logic gate;
- a sensing circuit coupled to the internal node and to a test output for sensing a voltage on the internal node and for outputting a signal indicating a level of said voltage, wherein the sensing circuit is not used during normal operation of the logic gate.

24. The integrated circuit of claim 23 wherein at least two of the test outputs of the plurality of logic gates are a common test output.

25. The integrated circuit of claim 23 wherein the sensing circuit includes only one field-effect-transistor (FET).

26. The integrated circuit of claim 23 wherein at least two of the test outputs of the plurality of logic gates are a unique test output for each logic gate.

27. The integrated circuit of claim 23 further comprising a pre-charge circuit coupled to each test output for pre-charging the test output to a pre-test voltage level.

28. A method of testing a logic gate having an internal node and a first input and a second input, wherein the internal node is a node of the logic gate other than an output of the logic gate, wherein a voltage on the internal node is a logical function of the first input and the second input during faultless operation of the logic gate, the method comprising:
- applying a test pattern to the first input and the second input of the logic gate;
- sensing the voltage on the internal node of the logic gate; and
- outputting a signal to a test output indicating a level of the voltage on the internal node.

29. The method of claim 28 further comprising capturing the signal.

30. The method of claim 29 further comprising: pre-charging the test output to a pre-test voltage level prior to capturing the signal.

* * * * *